US012364035B2

(12) United States Patent
Kwag

(10) Patent No.: US 12,364,035 B2
(45) Date of Patent: Jul. 15, 2025

(54) IMAGE SENSOR INCLUDING A PIXEL ARRAY HAVING PIXEL BLOCKS ARRANGED IN A ZIGZAG FORM

(71) Applicant: SK hynix Inc., Icheon-si (KR)

(72) Inventor: Pyong-Su Kwag, Chungcheongbuk-do (KR)

(73) Assignee: SK HYNIX INC., Icheon-si (KR)

( * ) Notice: Subject to any disclaimer, the term of this patent is extended or adjusted under 35 U.S.C. 154(b) by 147 days.

(21) Appl. No.: 17/322,131

(22) Filed: May 17, 2021

(65) Prior Publication Data

US 2021/0272993 A1 Sep. 2, 2021

Related U.S. Application Data

(62) Division of application No. 16/218,281, filed on Dec. 12, 2018, now Pat. No. 11,037,967.

(30) Foreign Application Priority Data

Jan. 29, 2018 (KR) .................. 10-2018-0010482

(51) Int. Cl.
 *H10F 39/18* (2025.01)
 *H04N 25/76* (2023.01)
 (Continued)

(52) U.S. Cl.
 CPC ..... *H10F 39/8023* (2025.01); *H04N 25/7795* (2023.01); *H04N 25/78* (2023.01);
 (Continued)

(58) Field of Classification Search
 CPC ................. H10F 39/8023; H10F 39/18; H10F 39/80373; H10F 39/813; H10F 39/011;
 (Continued)

(56) References Cited

U.S. PATENT DOCUMENTS 9,577,006 B2 2/2017 Itonaga et al.
2007/0177044 A1* 8/2007 Maruyama ............. H04N 25/00
  348/308
(Continued)

FOREIGN PATENT DOCUMENTS

CN 101359674 A 2/2009
CN 101777566 A 7/2010
(Continued)

OTHER PUBLICATIONS

Office Action for Chinese Patent Application No. 201811283320.7 mailed Jan. 29, 2021 (10 pages).

*Primary Examiner* — Moin M Rahman
(74) *Attorney, Agent, or Firm* — Perkins Coie LLP

(57) ABSTRACT

An image sensor may include a pixel array including a plurality of pixel blocks operable to convert light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit positioned between the first light receiving circuit and the second light receiving circuit; a second driving circuit positioned adjacent to the other side facing away from one side of the first light receiving circuit or the second light receiving circuit, which is adjacent to the first driving circuit; and a third driving circuit positioned adjacent to the first driving circuit or the second driving circuit.

18 Claims, 9 Drawing Sheets

(51) Int. Cl.
*H04N 25/78* (2023.01)
*H10F 39/00* (2025.01)

(52) U.S. Cl.
CPC .......... *H10F 39/18* (2025.01); *H10F 39/802* (2025.01); *H10F 39/80373* (2025.01); *H10F 39/813* (2025.01)

(58) Field of Classification Search
CPC ......... H10F 39/8037; H10F 39/12–199; H10F 39/802–80377; H10F 39/804; H10F 39/805–8057; H10F 39/806–8067; H10F 39/807; H10F 39/811; H10F 39/191–195; H10F 39/182–1825; H10F 39/014; H01L 27/14641; H01L 27/14612; H01L 27/14636; H01L 27/14605; H01L 25/167; H01L 27/3227; H01L 31/0284; H01L 31/1032; H01L 31/107; H01L 31/028; H01L 31/02164; H01L 31/1013; H01L 31/02162; H01L 31/03762; H01L 31/202; H01L 31/022475; H01L 27/14685; H01L 27/1461; H01L 27/14692; H01L 27/14649; H01L 31/103; H01L 27/14621; H01L 31/03529; H01L 27/14614; H01L 27/14609; H01L 27/1464; H01L 2924/12043; H01L 31/145–153; H01L 31/165–173; H01L 51/447; H01L 27/146–14893; H01L 27/14603–14616; H01L 27/14618; H01L 27/1462–14623; H01L 27/14625–14629; H01L 27/1463; H01L 27/14643–14663; H01L 27/14645–14647; H01L 29/4908; H01L 21/47635; H01L 29/66969; H01L 29/7869; H01L 29/78669; H01L 29/66765; H01L 21/32134; H01L 21/28088; H04N 5/3765; H04N 5/37455; H04N 5/369; H04N 5/345; H04N 5/378; H04N 5/3745; H04N 25/7795; H04N 25/78; H04N 25/44; H04N 25/70; H04N 25/59; H04N 25/623; G09G 2300/0452; G09G 2300/0443–0447; G09G 2300/0478–0495; H10K 59/123; H10K 59/35–353; H10D 86/441

See application file for complete search history.

(56) References Cited

U.S. PATENT DOCUMENTS

| | | | | |
|---|---|---|---|---|
| 2008/0088724 | A1* | 4/2008 | Kudoh | H04N 25/766 348/340 |
| 2009/0073294 | A1* | 3/2009 | Morimoto | H04N 25/766 348/300 |
| 2009/0102955 | A1 | 4/2009 | Hiyama et al. | |
| 2015/0349069 | A1 | 12/2015 | Xie et al. | |
| 2016/0336364 | A1 | 11/2016 | Itonaga et al. | |
| 2016/0372504 | A1* | 12/2016 | Kato | H01L 27/14636 |
| 2017/0092671 | A1 | 3/2017 | Yang | |
| 2018/0182804 | A1* | 6/2018 | Lee | H01L 27/14636 |

FOREIGN PATENT DOCUMENTS

| | | |
|---|---|---|
| CN | 101872587 A | 10/2010 |
| CN | 102157536 A | 8/2011 |
| CN | 102208420 A | 10/2011 |
| CN | 102595057 A | 7/2012 |
| CN | 102804385 A | 11/2012 |
| CN | 105554420 A | 5/2016 |
| CN | 106030804 A | 10/2016 |
| JP | 2013120813 A | 6/2013 |
| WO | 2018003012 A1 | 1/2018 |

\* cited by examiner

IMAGE SENSOR INCLUDING A PIXEL ARRAY HAVING PIXEL BLOCKS ARRANGED IN A ZIGZAG FORM

CROSS-REFERENCE TO RELATED APPLICATION

This patent document is a divisional of, and claims the priority and benefits of U.S. patent application Ser. No. 16/218,281, published as US 2019/0237497 A1, entitled "IMAGE SENSOR INCLUDING A PIXEL ARRAY HAVING PIXEL BLOCKS ARRANGED IN A ZIGZAG FORM," and filed on Dec. 12, 2018, which claims the priority and benefits of Korean Patent Application No. 10-2018-0010482 filed on Jan. 29, 2018. The contents of the before-mentioned patent applications are incorporated herein by reference in their entirety as part of the disclosure of this patent document.

TECHNICAL FIELD

Various embodiments relate to an image sensor.

BACKGROUND

An image sensor is a device that receives light from an optical image or one or more objects and converts the received light into electrical signals forming an image. Recently, with the development of the computer industry and communication industry, the demand for an image sensor having improved degree of integration and performance is increasing in various fields or applications, including, e.g., a digital camera, a camcorder, a portable device such as personal communication system, a game console, a security camera, a medical micro-camera and a robot.

SUMMARY

Various embodiments provide image sensors with improved performance.

In an embodiment, an image sensor may include a pixel array including a plurality of pixel blocks operable to convert light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit positioned between the first light receiving circuit and the second light receiving circuit; a second driving circuit positioned adjacent to the other side facing away from one side of the first light receiving circuit or the second light receiving circuit, which is adjacent to the first driving circuit; and a third driving circuit positioned adjacent to the first driving circuit or the second driving circuit. The plurality of pixel blocks may include a first pixel block and a second pixel block, which is positioned adjacent to the first pixel block in a first direction crossing the second direction, and the third driving circuit of the first pixel block is positioned closer to the first light receiving circuit or the second light receiving circuit of the second pixel block than the first light receiving circuit or the second light receiving circuit of the first pixel block.

In an embodiment, an image sensor may include a pixel array including a plurality of pixel blocks operable to convert light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a reset transistor positioned adjacent to the first light receiving circuit or the second light receiving circuit; a driver transistor positioned between the first light receiving circuit and the second light receiving circuit, and having a channel length corresponding to a pitch of the first light receiving circuit in a first direction crossing the second direction; and a selection transistor coupled in series to the driver transistor.

In an embodiment, an image sensor may include a pixel array including a plurality of pixel blocks, each including a plurality of pixels each converting light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit positioned between the first light receiving circuit and the second light receiving circuit, and including a reset transistor; and a second driving circuit positioned adjacent to the first light receiving circuit or the second light receiving circuit, and including a driver transistor and a selection transistor, which are coupled in series. A portion of the second driving circuit may have a shape that extends from the first light receiving circuit and the second light receiving circuit in a first direction crossing the second direction.

In an embodiment, an image sensor may include a pixel array including a plurality of pixel blocks, each including a plurality of pixels each converting light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit positioned between the first light receiving circuit and the second light receiving circuit; a second driving circuit positioned adjacent to the other side facing away from one side of the first light receiving circuit or the second light receiving circuit, which is adjacent to the first driving circuit; and a third driving circuit positioned adjacent to the first driving circuit or the second driving circuit. The plurality of pixel blocks may include a first pixel block and a second pixel block, which is positioned adjacent to the first pixel block in a first direction crossing the second direction, and the third driving circuit of the first pixel block is positioned closer to the first light receiving circuit or the second light receiving circuit of the second pixel block than the first light receiving circuit or the second light receiving circuit of the first pixel block.

In an embodiment, an image sensor may include a pixel array including a plurality of pixel blocks, each including a plurality of pixels each converting light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a reset transistor positioned adjacent to the first light receiving circuit or the second light receiving circuit; a driver transistor positioned between the first light receiving circuit and the second light receiving circuit, and having a channel length corresponding to a pitch of the first light receiving circuit in a first direction crossing the second direction; and a selection transistor coupled in series to the driver transistor.

In an embodiment, an image sensor may include a pixel array including a plurality of pixel blocks operable to convert light into electrical signals. Each of the plurality of pixel blocks may include a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit positioned between the first light receiving circuit and the second light receiving circuit, and including a reset transistor; and a second driving circuit positioned adjacent to the first light receiving circuit or the second light receiving circuit, and including a driver transistor and a selection transistor, which are coupled in series. A portion of the second driving circuit may have a shape that extends from the first light receiving circuit and the second light receiving circuit in a first direction crossing the second direction.

DETAILED DESCRIPTION

The disclosed image sensing technology based on a shared pixel structure can be implemented to achieve high-quality, high-resolution imaging while minimizing the size of an image sensor. In certain implementations, while the shared pixel structure may increase a fill factor (i.e., the ratio of pixel's light sensitive area to its total area, or the ratio of photodiode area to total pixel area), operation characteristics of certain shared pixel structures may deteriorate as the area of a driving circuit including pixel transistors decreases. In this regard, while the shared pixel structure may be designed to increase the light receiving area of a photoelectric conversion element, the performances of the pixel transistors such as driver transistor (DX), reset transistor (RX), and select transistor (ST) may degrade because areas in which the pixel transistors are formed are reduced relatively. Moreover, process deviations in manufacturing of a shared pixel structure may cause the pixels to have uneven characteristics and to be vulnerable to temporal noise.

In the shared pixel structure, differences in the types and shapes of structures adjacent to respective unit pixels sharing a floating diffusion, for example, conductive lines and the pixel transistors, may also cause unit pixels to have uneven characteristics due to the overlap capacitance or parasitic capacitance induced among them.

The disclosed technology provides image sensor techniques that can be used to mitigate one or more of those and other issues when implemented properly to provide an image sensor that has a shared pixel structure to provide a high-quality, high-resolution image and at the same time is capable of maximizing the sizes of the pixel transistors within a limited area.

In the specific examples described below, two different directions D1 and D2 are used to explain technical designs and features of certain implementations of the disclosed technology: the first direction D1 may be a horizontal direction or a row direction, and the second, different direction D2 may be a vertical direction or a column direction. While it is illustrated in some embodiments of the disclosed technology that the first direction D1 and the second direction D2 are a row direction and a column direction, respectively, it is to be noted that the disclosed technology is not limited thereto. For example, the first direction D1 may be a column direction, and the second direction D2 may be a row direction.

Figure 1:
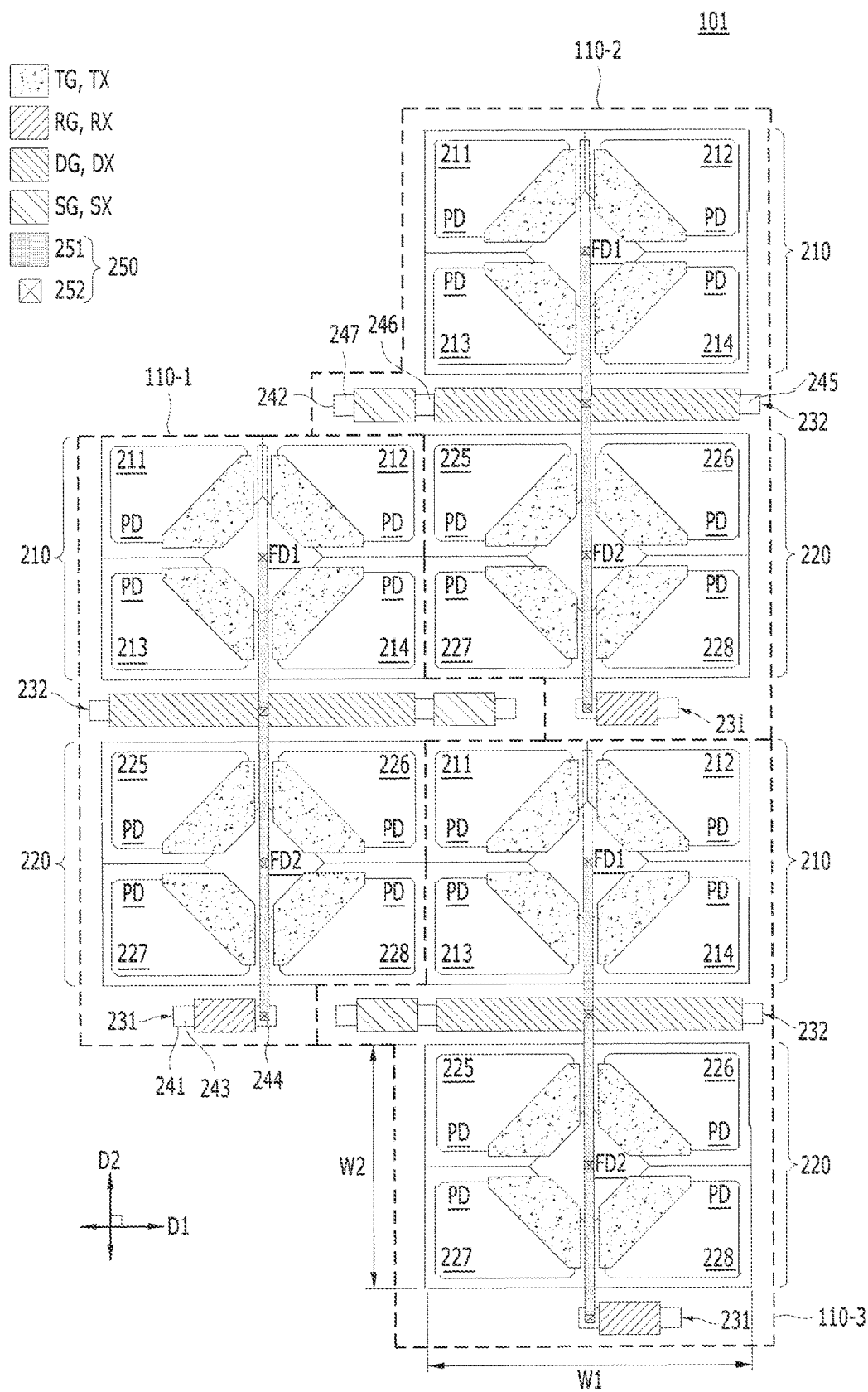
FIG. 1 is a layout illustrating an example of a sub pixel array of an image sensor based on an embodiment of the disclosed technology.
Figure 2:
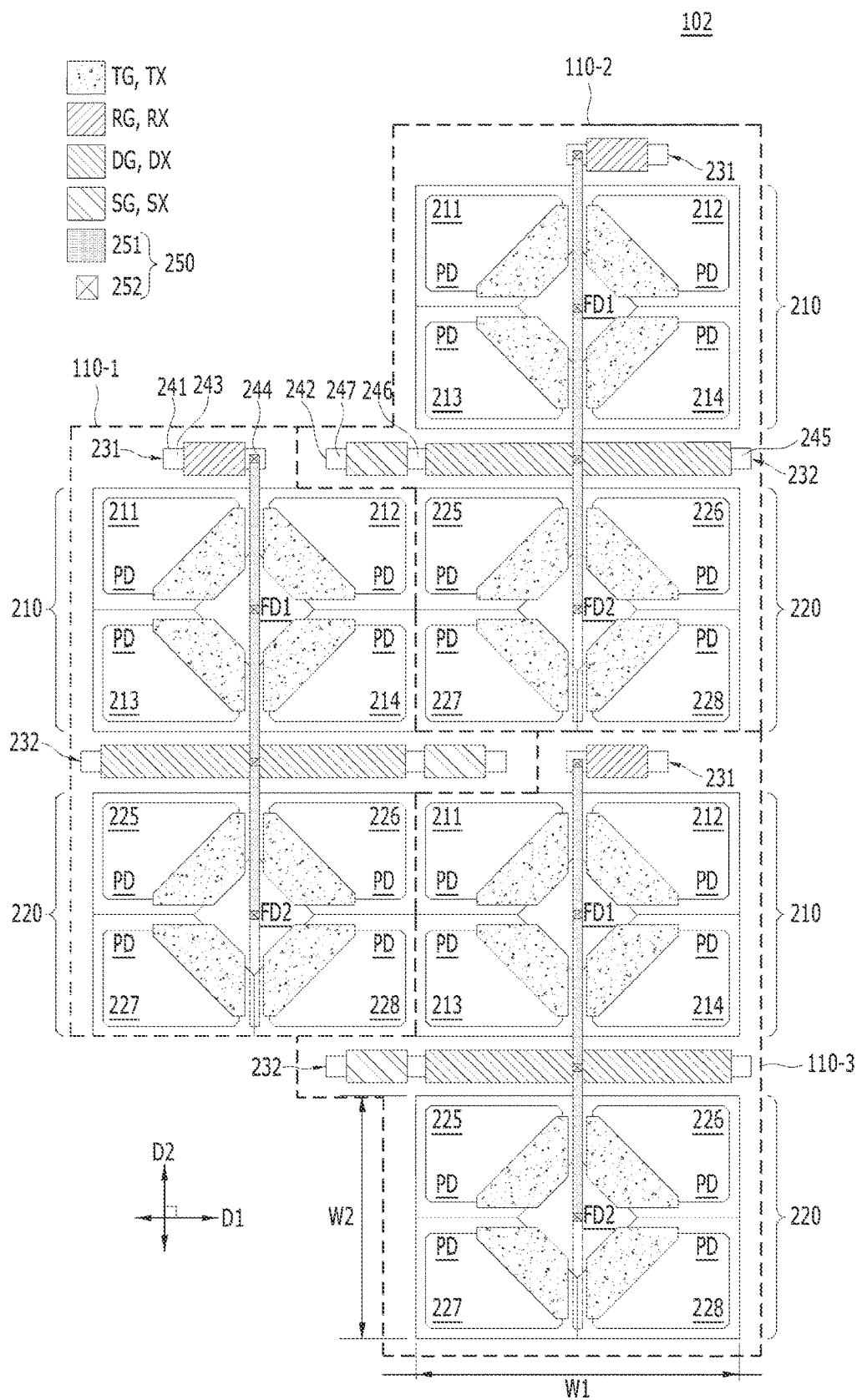
FIG. 2 is a layout illustrating an example of a sub pixel array of an image sensor based on a modification of the sub pixel array of the image sensor shown in FIG. 1.

FIG. 1 is a layout illustrating an example of a sub pixel array of an image sensor based on an embodiment of the disclosed technology, and FIG. 2 is a layout illustrating an example of a sub pixel array of an image sensor based on a modification of the sub pixel array of the image sensor shown in FIG. 1.

As shown in FIGS. 1 and 2, each of the image sensors implemented based on an embodiment of the disclosed technology and a modification of the image sensor illustrated in FIG. 1 may include a pixel array in which a plurality of sub pixel arrays are arranged. Each of the plurality of sub pixel arrays may include a plurality of pixel blocks 110-1, 110-2, 110-3. Hereinafter, for the sake of convenience in explanation, the sub pixel array implemented based on the example illustrated in FIG. 1 will be referred to as a "first sub pixel array 101," and the sub pixel array implemented based on the example illustrated in FIG. 2 will be referred to as a "second sub pixel array 102."

In each of the first and second sub pixel arrays 101 and 102, the plurality of pixel blocks 110-1, 110-2, 110-3 may be arranged in a zigzag form. For example, each of the first and second sub pixel arrays 101 and 102 may include at least three pixel blocks 110 disposed in a staggered manner with respect to one another. In this way, the image sensor implemented based on some embodiments of the disclosed technology may secure a space for pixel transistors to be formed in each of the plurality of pixel blocks 110, and may also reduce driving loads when pixel transistors operate. For example, when outputting an output signal, for example, an image signal or an image reset signal, from each of the pixel blocks 110-1, 110-2, 110-3, a driving load may be reduced.

In detail, each of the first and second sub pixel arrays 101 and 102 may include a first pixel block 110-1 to a third pixel block 110-3 which are disposed in a zigzag form. The first pixel block 110-1 to the third pixel block 110-3 may be arranged such that the first pixel block 110-1 is adjacent to the second pixel block 110-2 and the third pixel block 110-3 in the first direction D1, and the second pixel block 110-2 and the third pixel block 110-3 are aligned in the second direction D2. The shape of the second pixel block 110-2 may be a two-dimensional arrangement or in a planar arrangement that is identical to the two-dimensional arrangement or planar shape of the third pixel block 110-3. With respect to the boundary where the first pixel block 110-1 adjoins the second pixel block 110-2 and the third pixel block 110-3, regions of the two-dimensional arrangement of the first pixel block 110-1 and regions of the two-dimensional arrangement of the second pixel block 110-2 and regions of the two-dimensional arrangement of the third pixel block 110-3 may be symmetrical to each other. In the first direction D1, the upper region of the first pixel block 110-1 and the lower region of the second pixel block 110-2 are symmetrical about the boundary between them, and the lower region of the first pixel block 110-1 and the upper region of the third pixel block 110-3 are symmetrical about the boundary between them.

Each of the plurality of pixel blocks 110-1, 110-2, 110-3 may have a shared pixel structure. For example, each of the plurality of pixel blocks 110-1, 110-2, 110-3 may have an 8-shared pixel structure. The 8-shared pixel structure may easily increase the sizes of pixel transistors compared to a 4-shared pixel structure. In detail, each of the plurality of pixel blocks 110-1, 110-2, 110-3 may include a first light receiving circuit 210 which includes a plurality of unit pixels sharing a first floating diffusion FD1, a second light receiving circuit 220 which includes a plurality of unit pixels sharing a second floating diffusion FD2, a driving circuit which includes a reset transistor RX, a driver transistor DX and a selection transistor SX, and an intercoupling circuit 250 which electrically couples the first light receiving circuit 210, the second light receiving circuit 220 and the driving circuit. Here, the reset transistor RX, the driver transistor DX and the selection transistor SX may be referred to as pixel transistors.

In each of the plurality of pixel blocks 110-1, 110-2, 110-3, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214), which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the second direction D2. Therefore, the first floating diffusion FD1 and the second floating diffusion FD2 may also be aligned in the second direction D2. In other words, the first floating diffusion FD1 and the second floating diffusion FD2 may be positioned on the same line in the second direction D2. The first floating diffusion FD1 and the second floating diffusion FD2 may be electrically coupled to each other through the intercoupling circuit 250.

In each of the plurality of pixel blocks 110-1, 110-2, 110-3, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width in the row direction, and the second pitch W2 may be a width in the column direction. The first pitch W1 and the second pitch W2 may have the same length (W1=W2) or the first pitch W1 may be larger than the second pitch W2 due to the disposition of the driving circuit in the pixel block 110 (W1>W2). It is illustrated in FIGS. 1 and 2 that the first pitch W1 is larger than the second pitch W2 for example.

Figure 5:
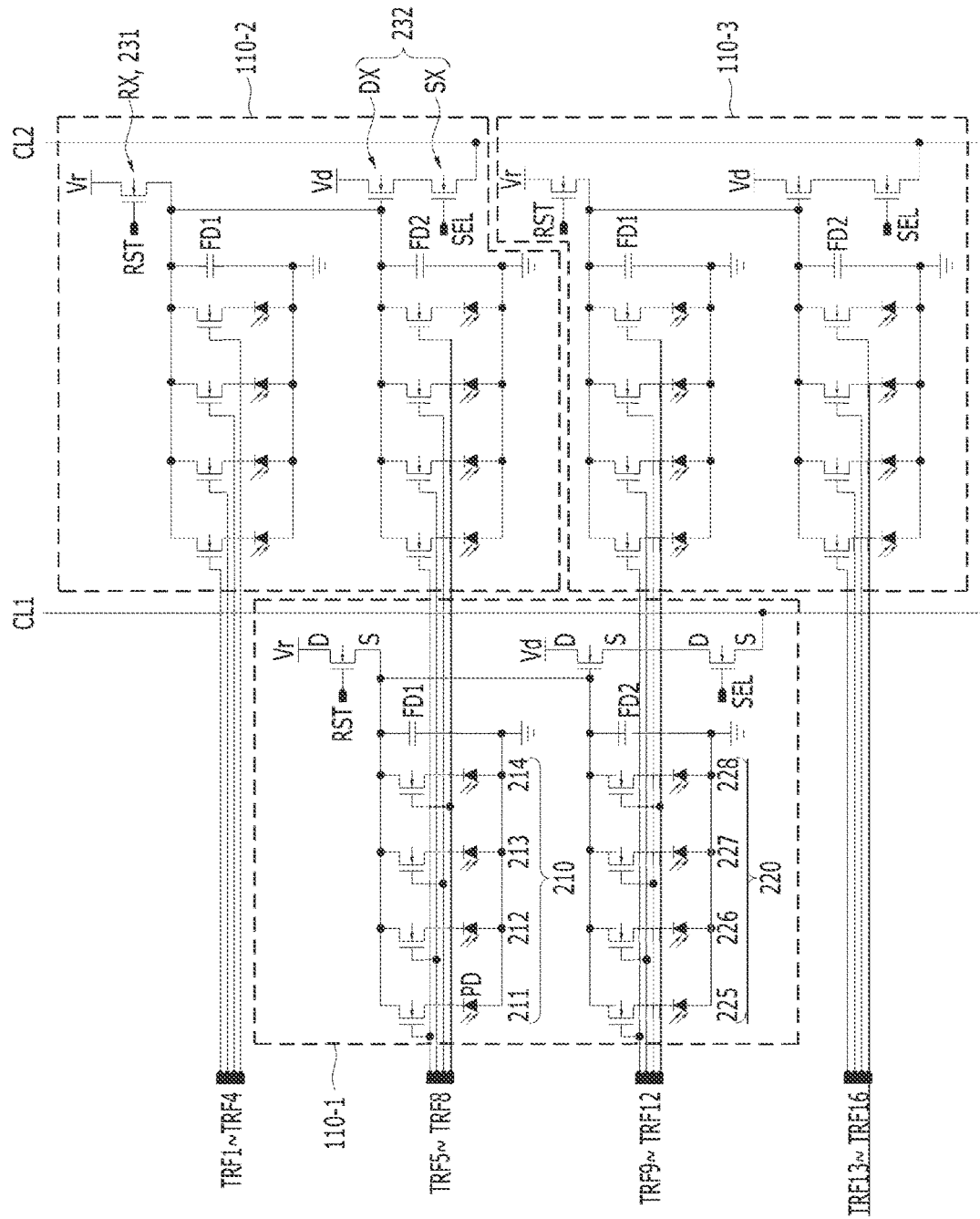
FIG. 5 is an equivalent circuit diagram corresponding to a first sub pixel array to a fourth sub pixel array of the image sensor based on some embodiments of the disclosed technology.

In each of the plurality of pixel blocks 110-1, 110-2, 110-3, each of the first unit pixel 211 to the eighth unit pixel 228 may include a photoelectric conversion element PD which generates photocharges in response to incident light and a transfer transistor TX which transfers the photocharges generated in the photoelectric conversion element PD, to the floating diffusion FD in response to a transfer signal TRF (see FIG. 5). The floating diffusion FD may temporarily store the photocharges generated in the photoelectric conversion element PD. The photoelectric conversion element PD may include a photodiode, a phototransistor, a photogate, a pinned photodiode (PPD) or a combination thereof. For example, the photoelectric conversion element PD may include organic or/and inorganic photodiodes. In detail, the photoelectric conversion element PD may include either one of organic and inorganic photodiodes, or may be formed by stacking an organic photodiode and an inorganic photodiode on top of one another. The transfer signal TRF may be generated in a row driver (see the reference numeral 150 of FIG. 8), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110-1, 110-2, 110-3, the driving circuit may include a first driving circuit 231 and a second driving circuit 232. In the first sub pixel array 101, the first driving circuit 231 of the first pixel block 110-1 may be aligned with the second driving circuit 232 of the third pixel block 110-3 in the first direction D1, and the second driving circuit 232 of the first pixel block 110-1 may be aligned with the first driving circuit 231 of the second pixel block 110-2 in the first direction D1. In other words, in the first direction D1, the first driving circuit 231 of the first pixel block 110-1 and the second driving circuit 232 of the third pixel block 110-3 may be disposed side-by-side. Conversely, in the second sub pixel array 102, the first driving circuit 231 of the first pixel block 110-1 may be aligned with the second driving circuit 232 of the second pixel block 110-2 in the first direction D1, and the second driving circuit 232 of the first pixel block 110-1 may be aligned with the first driving circuit 231 of the third pixel block 110-3 in the first direction D1. In other words, in the first direction D1, the first driving circuit 231 of the first pixel block 110-1 and the second driving circuit 232 of the second pixel block 110-2 may be disposed side-by-side. In the first and second sub pixel arrays 101 and 102, the positions of the first driving circuit 231 and the second driving circuit 232 of each of the plurality of pixel blocks 110 may be different from each other. In other words, in the first and second sub pixel arrays 101 and 102, first driving circuits 231 and second driving circuits 232 may be positioned at different rows. In the first and second sub pixel arrays 101 and 102, the first driving circuit 231 and the second driving circuit 232 of each of the plurality of pixel blocks 110 may be disposed in a zigzag manner, and in this way, the interference between the first driving circuit 231 and the second driving circuit 232 may be minimized. In particular, interference to the second driving circuit 232, which is sensitive to noise, may be minimized.

The first driving circuit 231 may initialize the first floating diffusion FD1, the second floating diffusion FD2, and the photoelectric conversion elements PD to remove previously accumulated charges therein in response to a reset signal RST (see FIG. 5). The second driving circuit 232 may generate an output signal corresponding to the amount of the photocharges generated in the first light receiving circuit 210 and the second light receiving circuit 220, and may output the output signal to a column line (not shown) in response to a select signal SEL (see FIG. 5) which is applied through a row line (not shown). The reset signal RST and the select signal SEL may be generated in the row driver (see the reference numeral 150 of FIG. 8), and may be applied to the reset transistor RX and the selection transistor SX through row lines (not shown) which extend from the row driver and are coupled to a reset gate RG and a selection gate SG, respectively.

In the first sub pixel array 101, the first driving circuit 231 may be positioned adjacent to the second light receiving circuit 220. For example, the first driving circuit 231 may be positioned adjacent to the seventh unit pixel 227 of the second light receiving circuit 220. Conversely, in the second sub pixel array 102, the first driving circuit 231 may be positioned adjacent to the first light receiving circuit 210. For example, the first driving circuit 231 may be positioned adjacent to the first unit pixel 211 of the first light receiving circuit 210.

The first driving circuit 231 may include the reset transistor RX which performs a reset operation by removing previously accumulated charges in a photoelectric conversion element PD. The reset transistor RX may include a first active region 241, the reset gate RG, which is formed on the first active region 241, and a first junction region 243 and a second junction region 244, which are formed in the first active region 241 at both sides of the reset gate RG. The first active region 241 may have a bar shape that has a major axis extending in the first direction D1 and a minor axis extending in the second direction D2. The reset signal RST may be applied to the reset gate RG. The first junction region 243 may be the drain of the reset transistor RX. The reset transistor RX may be supplied with a reset voltage Vr through the first junction region 243. The reset voltage Vr may be a positive voltage. For example, the reset voltage Vr may be a power supply voltage (VDD) or a positive voltage larger than the power supply voltage (VDD). The second junction region 244 may be the source of the reset transistor RX. In the second direction D2, the second junction region 244 may be aligned with the first floating diffusion FD1 and the second floating diffusion FD2. Namely, the first floating diffusion FD1, the second floating diffusion FD2 and the second junction region 244 may be positioned on the same line in the second direction D2. This is to control the shape of the intercoupling circuit 250 and thereby prevent characteristic degradation due to the intercoupling circuit 250. The second junction region 244 may be electrically coupled to the intercoupling circuit 250, and may be electrically coupled to the first floating diffusion FD1 and the second floating diffusion FD2 through the intercoupling circuit 250.

In the first and second sub pixel arrays 101 and 102, the second driving circuit 232 may be positioned between the first light receiving circuit 210 and the second light receiving circuit 220, and may include a portion that projects out from the light receiving circuits 210 and 220 in the first direction D1. That is to say, the second driving circuit 232 may be positioned between the first light receiving circuit 210 and the second light receiving circuit 220, and may include the portion of the second driving circuit 232 extending between adjacent light receiving circuits 210 and 220. For example, the second driving circuit 232 of the first pixel block 110-1 may be positioned between the first light receiving circuit 210 and the second light receiving circuit 220 of the first pixel block 110-1, and may include a portion of the second driving circuit 232 extending between the second light receiving circuit 220 of the second pixel block 110-2 and the first light receiving circuit 210 of the third pixel block 110-3. In each of the plurality of pixel blocks 110, since the forming positions of the first driving circuit 231 and the second driving circuit 232 are different and the second driving circuit 232 includes a portion of the second driving circuit 232 extending between adjacent light receiving circuits 210 and 220, it is possible to easily increase the sizes of the pixel transistors to provide the pixel transistors having maximum sizes within a limited area.

The second driving circuit 232 may include the driver transistor DX that turns on or off power to each corresponding light receiving circuit and the selection transistor SX that selects pixels or pixel blocks for output signals. In the second driving circuit 232, the driver transistor DX and the selection transistor SX may be coupled in series. The driver transistor DX may have a channel length corresponding to the first pitch W1 of the light receiving circuits 210 and 220 to effectively prevent noise from causing characteristic degradation. The selection transistor SX may be positioned between adjacent light receiving circuits 210 and 220 to reduce a driving load when outputting an output signal such as an image signal or an image reset signal. In other words, in each of the plurality of pixel blocks 110, the selection transistor SX may have a shape that protrudes in the first direction D1. For example, in the first and second sub pixel arrays 101 and 102, the selection transistor SX of the first pixel block 110-1 may be positioned between the second light receiving circuit 220 of the second pixel block 110-2 and the first light receiving circuit 210 of the third pixel block 110-3. Namely, the selection transistor SX of the first pixel block 110-1 may be positioned more adjacent to the second pixel block 110-2 and the third pixel block 110-3 than the first pixel block 110-1.

The driver transistor DX and the selection transistor SX, which are coupled in series, may have the shapes that share a second active region 242. The driver transistor DX and the selection transistor SX may include a driver gate DG and the selection gate SG, respectively, which are formed on the second active region 242. The second active region 242 may have a bar shape that has a major axis extending in the first direction D1 and a minor axis extending in the second direction D2. The driver gate DG may have a length corresponding to the first pitch W1, and may be electrically coupled to the first floating diffusion FD1, the second floating diffusion FD2 and the source of the reset transistor RX through the intercoupling circuit 250. A row line (not shown) may be coupled to the selection gate SG.

Junction regions may be formed in the second active region 242 at both sides of the driver gate DG and the selection gate SG. A third junction region 245 may be formed in the second active region 242 at one side of the driver gate DG. A fourth junction region 246 may be formed in the second active region 242 at the other side of the driver gate DG between the driver gate DG and one side of the selection gate SG. A fifth junction region 247 may be formed in the second active region 242 at the other side of the selection gate SG. The third junction region 245 may be the drain of the driver transistor DX. The driver transistor DX may be supplied with a driver voltage Vd through the third junction region 245. The driver voltage Vd may be a positive voltage. For example, the driver voltage Vd may be the power supply voltage (VDD) or another positive voltage larger than the power supply voltage (VDD). The fourth junction region 246 may be the source of the driver transistor DX and the drain of the selection transistor SX. The fifth junction region 247 may be the source of the selection transistor SX. The fifth junction region 247 may be coupled to a column line (not shown), and an output signal may be transferred to the column line through the fifth junction region 247. Because the positions of the first driving circuit 231 and the second driving circuit 232 are different and the first driving circuit 231 and the second driving circuit 232 are separated from each other, a first power line, which supplies the driver voltage Vd to the driver transistor DX, and a second power line, which supplies the reset voltage Vr to the reset transistor RX, may be separated from each other. In this way, when the first driving circuit 231 and the second driving circuit 232 operate, driving loads may be effectively reduced.

In each of the plurality of pixel blocks 110-1, 110-2, 110-3, the intercoupling circuit 250 may electrically couple the first floating diffusion FD1 of the first light receiving circuit 210, the second floating diffusion FD2 of the second light receiving circuit 220, the source of the reset transistor RX of the first driving circuit 231, and the driver gate DG of the second driving circuit 232 to each other. Thus, the intercoupling circuit 250 may include a conductive line 251 and contacts 252, which couple the conductive line 251 to the first floating diffusion FD1, the second floating diffusion FD2, the source of the reset transistor RX, and the driver gate DG.

The conductive line 251 may have a line shape that extends in the second direction D2. This is to prevent characteristic degradation due to the shape of the intercoupling circuit 250. By controlling the parasitic capacitances existing between the intercoupling circuit 250 and the plurality of unit pixels (e.g., the first unit pixel 211 to the eighth unit pixel 228) to have a constant value, it is possible to allow the plurality of unit pixels to have uniform characteristics. In order to effectively prevent characteristic degradation that might be caused by the shape of the intercoupling circuit 250, the conductive line 251 of the intercoupling circuit 250 implemented based on an embodiment of the disclosed technology may further extends from the first floating diffusion FD1 between the first unit pixel 211 and the second unit pixel 212 as shown by the dash-dotted lines in FIG. 1. Also, as a modification of the conductive line 251 of the intercoupling circuit 250 illustrated in FIG. 1, the conductive line 251 of the intercoupling circuit 250 may further extend from the second floating diffusion FD2 between the seventh unit pixel 227 and the eighth unit pixel 228 as shown by the dash-dotted lines in FIG. 2.

As described above, in the image sensors implemented based on an embodiment of the disclosed technology illustrated in FIG. 1 and FIG. 2, in each of the plurality of pixel blocks 110, since the positions of the first driving circuit 231 and the second driving circuit 232 are different and the second driving circuit 232 includes the portion of the second driving circuit 232 extending between adjacent light receiving circuits 210 and 220, it is possible to easily increase the sizes of the pixel transistors to provide the pixel transistors having maximum sizes within a limited area. By providing the driver transistor DX, which has a channel length corresponding to the first pitch W1 of the first light receiving circuit 210 and the second light receiving circuit 220, the operational characteristics of the image sensors may be significantly improved.

Moreover, the plurality of pixel blocks 110 arranged in a zigzag form in the first and second sub pixel arrays 101 and 102 makes better use of a space in which the driving circuit including the pixel transistors is formed, and driving loads for the first driving circuit 231 and the second driving circuit 232 may decrease. This will be described later in detail with reference to FIG. 5.

Further, in the first and second sub pixel arrays 101 and 102, since the first driving circuit 231 and the second driving circuit 232 of each of the plurality of pixel blocks 110 are disposed in a zigzag manner, it is possible to prevent the characteristics of the first driving circuit 231 and the second driving circuit 232 from degrading due to interference.

Figure 3:
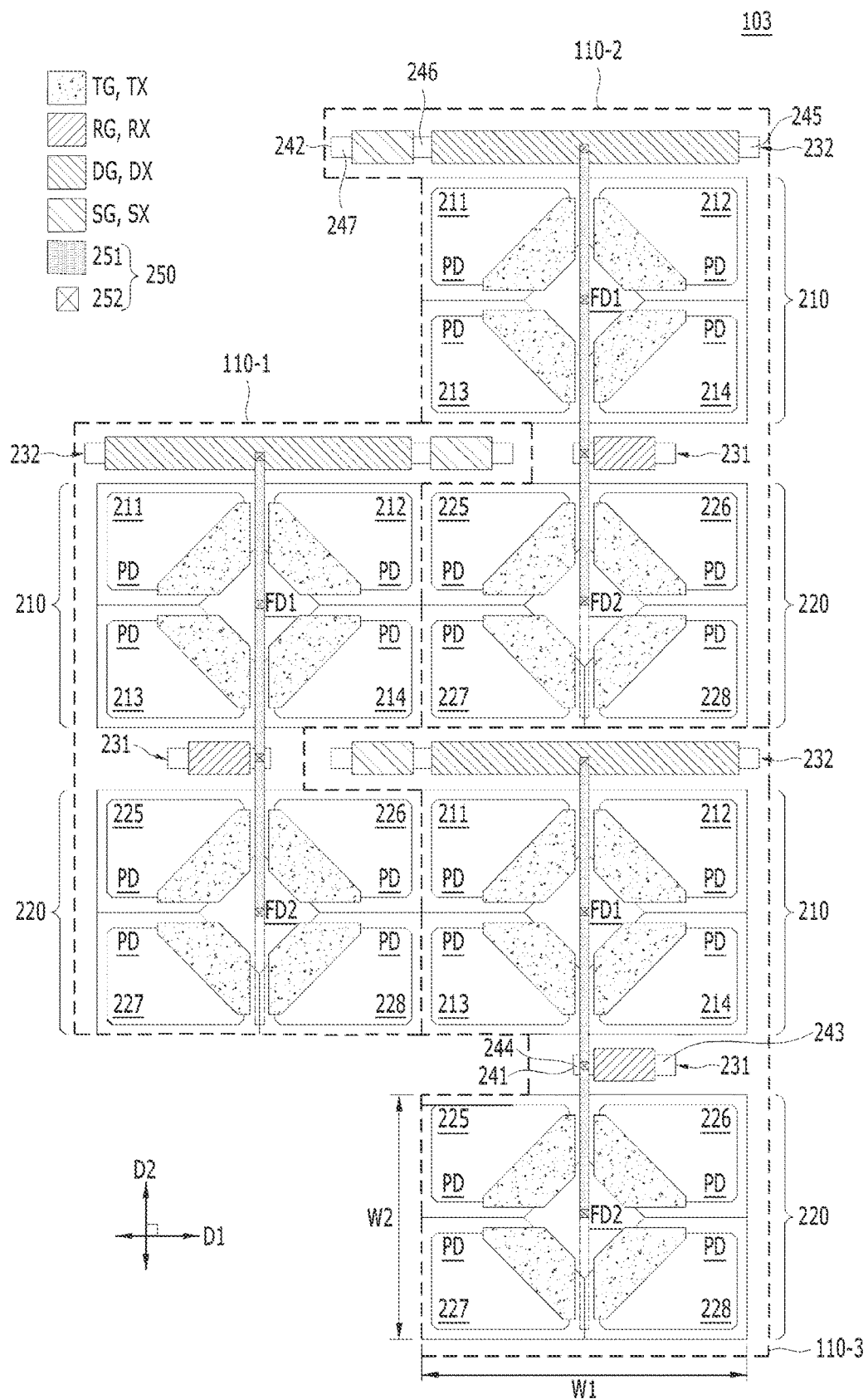
FIG. 3 is a layout illustrating an example of a sub pixel array of an image sensor based on another embodiment of the disclosed technology.
Figure 4:
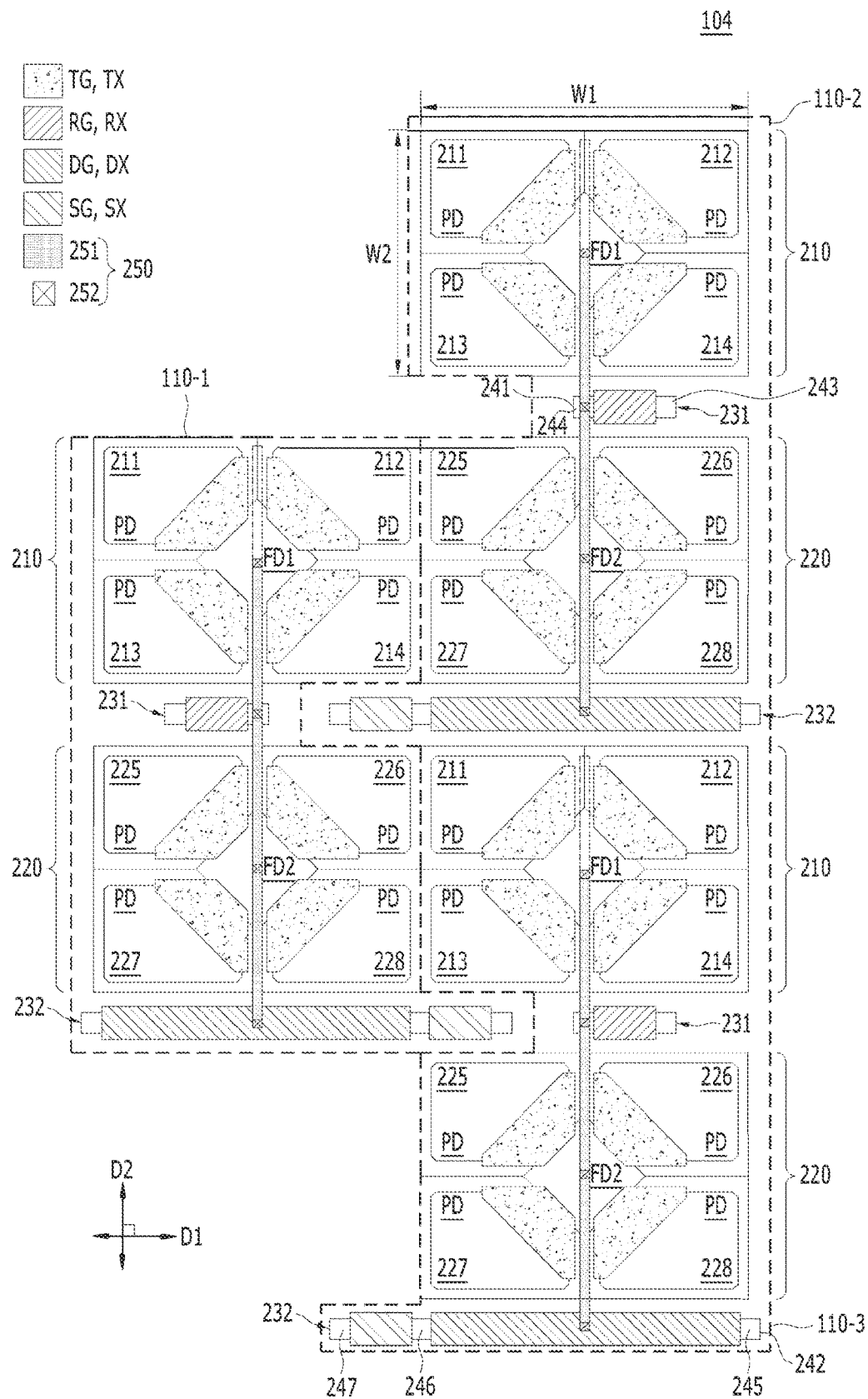
FIG. 4 is a layout illustrating an example of a sub pixel array of an image sensor based on a modification of the sub pixel array of the image sensor shown in FIG. 3.

FIG. 3 is a layout illustrating an example of a sub pixel array of an image sensor based on another embodiment of the disclosed technology, and FIG. 4 is a layout illustrating an example of a sub pixel array of an image sensor based on a modification of the sub pixel array of the image sensor shown in FIG. 3.

As shown in FIGS. 3 and 4, each of the image sensors implemented based on another embodiment of the disclosed technology and a modification of the image sensor illustrated in FIG. 3 may include a pixel array in which a plurality of sub pixel arrays are arranged. Each of the plurality of sub pixel arrays may include a plurality of pixel blocks 110. Hereinafter, for the sake of convenience in explanation, the sub pixel array implemented based on the example illustrated in FIG. 3 will be referred to as a "third sub pixel array 103," and the sub pixel array implemented based on the example illustrated in FIG. 4 will be referred to as a "fourth sub pixel array 104."

In each of the third and fourth sub pixel arrays 103 and 104, the plurality of pixel blocks 110 may be arranged in a zigzag form. For example, each of the third and fourth sub pixel arrays 103 and 104 may include at least three pixel blocks 110 disposed in a staggered manner with respect to one another. In this way, the image sensor implemented based on some embodiments of the disclosed technology may secure a space for pixel transistors to be formed in each of the plurality of pixel blocks 110, and may also reduce driving loads when pixel transistors operate. For example, when outputting an output signal, for example, an image signal or an image reset signal, from each of the pixel blocks 110, a driving load may be reduced.

In detail, each of the third and fourth sub pixel arrays 103 and 104 may include a first pixel block 110-1 to a third pixel block 110-3 which are disposed in a zigzag form. The first pixel block 110-1 to the third pixel block 110-3 may be arranged such that the first pixel block 110-1 is adjacent to the second pixel block 110-2 and the third pixel block 110-3 in the first direction D1, and the second pixel block 110-2 and the third pixel block 110-3 are aligned in the second direction D2. The two-dimensional arrangement of the second pixel block 110-2 may be identical to the two-dimensional arrangement of the third pixel block 110-3. With respect to the boundary where the first pixel block 110-1 adjoins the second pixel block 110-2 and the third pixel block 110-3, regions of the two-dimensional arrangement of the first pixel block 110-1 and regions of the two-dimensional arrangement of the second pixel block 110-2 and regions of the two-dimensional arrangement of the third pixel block 110-3 may be symmetrical to each other. In the first direction D1, the upper region of the first pixel block 110-1 and the lower region of the second pixel block 110-2 are symmetrical about the boundary between them, and the lower region of the first pixel block 110-1 and the upper region of the third pixel block 110-3 are symmetrical about the boundary between them.

Each of the plurality of pixel blocks 110-1, 110-2, 110-3 may have a shared pixel structure. For example, each of the plurality of pixel blocks 110 may have an 8-shared pixel structure. The 8-shared pixel structure may easily increase the sizes of pixel transistors compared to a 4-shared pixel structure. In detail, each of the plurality of pixel blocks 110-1, 110-2, 110-3 may include a first light receiving circuit 210 which includes a plurality of unit pixels sharing a first floating diffusion FD1, a second light receiving circuit 220 which includes a plurality of unit pixels sharing a second floating diffusion FD2, a driving circuit which includes a reset transistor RX, a driver transistor DX and a selection transistor SX, and an intercoupling circuit 250 which electrically couples the first light receiving circuit 210, the second light receiving circuit 220 and the driving circuit. Here, the reset transistor RX, the driver transistor DX and the selection transistor SX may be referred to as pixel transistors.

The first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214) which share the first floating diffusion FD1 and are arranged in a 2×2 matrix structure. The second light receiving circuit 220 may include four unit pixels (e.g., a fifth unit pixel 225 to an eighth unit pixel 228) which share the second floating diffusion FD2 and are arranged in a 2×2 matrix structure. The first light receiving circuit 210 and the second light receiving circuit 220 may be positioned adjacent to each other, and may be aligned in the second direction D2. Therefore, the first floating diffusion FD1 and the second floating diffusion FD2 may also be aligned in the second direction D2. In other words, the first floating diffusion FD1 and the second floating diffusion FD2 may be positioned on the same line in the second direction D2. The first floating diffusion FD1 and the second floating diffusion FD2 may be electrically coupled to each other through the intercoupling circuit 250. The first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width extending in the row direction, and the second pitch W2 may be a width extending in the column direction. The first pitch W1 and the second pitch W2 may have the same length (W1=W2) or the first pitch W1 may be larger than the second pitch W2 due to the disposition of the driving circuit in the pixel block 110 (W1>W2). It is illustrated in FIGS. 3 and 4 that the first pitch W1 is larger than the second pitch W2 (W1>W2) for example.

Each of the first unit pixel 211 to the eighth unit pixel 228 may include a photoelectric conversion element PD which generates photocharges in response to incident light and a transfer transistor TX which transfers the photocharges generated in the photoelectric conversion element PD, to the floating diffusion FD in response to a transfer signal TRF (see FIG. 5). The floating diffusion FD may temporarily store the photocharges generated in the photoelectric conversion element PD. The photoelectric conversion element PD may include a photodiode, a phototransistor, a photogate, a pinned photodiode (PPD) or a combination thereof. For example, the photoelectric conversion element PD may include organic or/and inorganic photodiodes. In detail, the photoelectric conversion element PD may include either one of organic and inorganic photodiodes, or may be formed by stacking an organic photodiode and an inorganic photodiode on top of one another. The transfer signal TRF may be generated in a row driver (see the reference numeral 150 of FIG. 8), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110-1, 110-2, 110-3, the driving circuit may include a first driving circuit 231 and a second driving circuit 232. In the third sub pixel array 103, the first driving circuit 231 of the first pixel block 110-1 may be aligned with the second driving circuit 232 of the third pixel block 110-3 in the first direction D1, and the second driving circuit 232 of the first pixel block 110-1 may be aligned with the first driving circuit 231 of the second pixel block 110-2 in the first direction D1. Conversely, in the fourth sub pixel array 104, the first driving circuit 231 of the first pixel block 110-1 may be aligned with the second driving circuit 232 of the second pixel block 110-2 in the first direction D1, and the second driving circuit 232 of the first pixel block 110-1 may be aligned with the first driving circuit 231 of the third pixel block 110-3 in the first direction D1. In the third and fourth sub pixel arrays 103 and 104, the positions of the first driving circuit 231 and the second driving circuit 232 of each of the plurality of pixel blocks 110 may be different from each other. In other words, in the third and fourth sub pixel arrays 103 and 104, first driving circuits 231 and second driving circuits 232 may be positioned at different rows. In the third and fourth sub pixel arrays 103 and 104, the first driving circuit 231 and the second driving circuit 232 of each of the plurality of pixel blocks 110 may be disposed in a zigzag manner, and in this way, the interference between the first driving circuit 231 and the second driving circuit 232 may be minimized. In particular, interference to the second driving circuit 232, which is sensitive to noise, may be minimized.

The first driving circuit 231 may initialize the first floating diffusion FD1, the second floating diffusion FD2, and the photoelectric conversion elements PD in response to a reset signal RST (see FIG. 5). The second driving circuit 232 may generate an output signal corresponding to the amount of the photocharges generated in the first light receiving circuit 210 and the second light receiving circuit 220, and may output the output signal to a column line (not shown) in response to a select signal SEL (see FIG. 5) which is applied through a row line (not shown). The reset signal RST and the select signal SEL may be generated in the row driver (see the reference numeral 150 of FIG. 8), and may be applied to the reset transistor RX and the selection transistor SX through row lines (not shown) which extend from the row driver and are coupled to a reset gate RG and a selection gate SG, respectively.

In the third and fourth sub pixel arrays 103 and 104, the first driving circuit 231 may be positioned between the first light receiving circuit 210 and the second light receiving circuit 220. The first driving circuit 231 may include the reset transistor RX. The reset transistor RX may include a first active region 214, the reset gate RG, which is formed on the first active region 241, and a first junction region 243 and a second junction region 244, which are formed in the first active region 241 at both sides of the reset gate RG. The first active region 241 may have a bar shape that has a major axis extending in the first direction D1 and a minor axis extending in the second direction D2. The reset signal RST may be applied to the reset gate RG. The first junction region 243 may be the drain of the reset transistor RX. The reset transistor RX may be supplied with a reset voltage Vr through the first junction region 243. The reset voltage Vr may be a positive voltage. For example, the reset voltage Vr may be a power supply voltage (VDD) or a positive voltage larger than the power supply voltage (VDD). The second junction region 244 may be the source of the reset transistor RX. In the second direction D2, the second junction region 244 may be aligned with the first floating diffusion FD1 and the second floating diffusion FD2. Namely, the first floating diffusion FD1, the second floating diffusion FD2 and the second junction region 244 may be positioned on the same line in the second direction D2. This is to control the shape of the intercoupling circuit 250 and thereby prevent characteristic degradation due to the intercoupling circuit 250. The second junction region 244 may be electrically coupled to the intercoupling circuit 250, and may be electrically coupled to the first floating diffusion FD1 and the second floating diffusion FD2 through the intercoupling circuit 250.

In the third sub pixel array 103, the second driving circuit 232 may be positioned adjacent to the first light receiving circuit 210. Conversely, in the fourth sub pixel array 104, the second driving circuit 232 may be positioned adjacent to the second light receiving circuit 220. In the third and fourth sub pixel arrays 103 and 104, the second driving circuit 232 may be positioned adjacent to the first light receiving circuit 210 or the second light receiving circuit 220, and may include a portion that projects out from the light receiving circuits 210 and 220 in the first direction D1. That is to say, the second driving circuit 232 may be positioned adjacent to the first light receiving circuit 210 or the second light receiving circuit 220, and may include the portion of the second driving circuit 232 extending between adjacent light receiving circuits 210 and 220. For example, in the third sub pixel array 103, the second driving circuit 232 of the first pixel block 110-1 may include the portion of the second driving circuit 232 extending between the first light receiving circuit 210 and the second light receiving circuit 220 of the second pixel block 110-2. Conversely, in the fourth sub pixel array 104, the second driving circuit 232 of the first pixel block 110-1 may have include the portion of the second driving circuit 232 extending between the first light receiving circuit 210 and the second light receiving circuit 220 of the third pixel block 110-3. In each of the plurality of pixel blocks 110, since the positions of the first driving circuit 231 and the second driving circuit 232 are different and the second driving circuit 232 includes a portion of the second driving circuit 232 extending between adjacent light receiving circuits 210 and 220, it is possible to easily increase the sizes of the pixel transistors to provide the pixel transistors having maximum sizes within a limited area.

The second driving circuit 232 may include the driver transistor DX and the selection transistor SX. In the second driving circuit 232, the driver transistor DX and the selection transistor SX may be coupled in series. The driver transistor DX may have a channel length corresponding to the first pitch W1 of the light receiving circuits 210 and 220 to effectively prevent noise from causing characteristic degradation. The selection transistor SX may be positioned between adjacent light receiving circuits 210 and 220 to reduce a driving load when outputting an output signal such as an image signal or an image reset signal. In other words, in each of the plurality of pixel blocks 110-1, 110-2, 110-3, the selection transistor SX may have a shape that protrudes in the first direction D1. For example, in the third sub pixel array 103, the selection transistor SX of the first pixel block 110-1 may be positioned between the first light receiving circuit 210 and the second light receiving circuit 220 of the second pixel block 110-2. Conversely, in the fourth sub pixel array 104, the selection transistor SX of the first pixel block 110-1 may be positioned between the first light receiving circuit 210 and the second light receiving circuit 220 of the third pixel block 110-3. Namely, in the third sub pixel array 103 and the fourth sub pixel array 104, the selection transistor SX of the first pixel block 110-1 may be positioned closer to the second pixel block 110-2 or the third pixel block 110-3 than the first pixel block 110-1.

The driver transistor DX and the selection transistor SX, which are coupled in series, may have the shapes that share a second active region 242. The driver transistor DX and the selection transistor SX may include a driver gate DG and the selection gate SG, respectively, which are formed on the second active region 242. The second active region 242 may have a bar shape that has a major axis extending in the first direction D1 and a minor axis extending in the second direction D2. The driver gate DG may have a length corresponding to the first pitch W1, and may be electrically coupled to the first floating diffusion FD1, the second floating diffusion FD2 and the source of the reset transistor RX through the intercoupling circuit 250. A row line (not shown) may be coupled to the selection gate SG.

Junction regions may be formed in the second active region 242 at both sides of the driver gate DG and the selection gate SG. A third junction region 245 may be formed in the second active region 242 at one side of the driver gate DG. A fourth junction region 246 may be formed in the second active region 242 at the other side of the driver gate DG between the driver gate DG and one side of the selection gate SG. A fifth junction region 247 may be formed in the second active region 242 at the other side of the selection gate SG. The third junction region 245 may be the drain of the driver transistor DX. The driver transistor DX may be supplied with a driver voltage Vd through the third junction region 245. The driver voltage Vd may be a positive voltage. For example, the driver voltage Vd may be the power supply voltage (VDD) or another positive voltage larger than the power supply voltage (VDD). The fourth junction region 246 may be the source of the driver transistor DX and the drain of the selection transistor SX. The fifth junction region 247 may be the source of the selection transistor SX. The fifth junction region 247 may be coupled to a column line (not shown), and an output signal may be transferred to the column line through the fifth junction region 247. Because the positions of the first driving circuit 231 and the second driving circuit 232 are different from each other, a first power line, which supplies the driver voltage Vd to the driver transistor DX, and a second power line which supplies the reset voltage Vr to the reset transistor RX may be separated from each other. In this way, when the first driving circuit 231 and the second driving circuit 232 operate, driving loads may be effectively reduced.

In each of the plurality of pixel blocks 110-1, 110-2, 110-3, the intercoupling circuit 250 may electrically couple the first floating diffusion FD1 of the first light receiving circuit 210, the second floating diffusion FD2 of the second light receiving circuit 220, the source of the reset transistor RX of the first driving circuit 231, and the driver gate DG of the second driving circuit 232 to each other. Thus, the intercoupling circuit 250 may include a conductive line 251 and contacts 252, which couple the conductive line 251 to the first floating diffusion FD1, the second floating diffusion FD2, the source of the reset transistor RX, and the driver gate DG.

The conductive line 251 may have a line shape that extends in the second direction D2. This is to prevent characteristic degradation due to the shape of the intercoupling circuit 250. By controlling the parasitic capacitances existing between the intercoupling circuit 250 and the plurality of unit pixels (e.g., the first unit pixel 211 to the eighth unit pixel 228) to have a constant value, it is possible to allow the plurality of unit pixels to have uniform characteristics. In order to effectively prevent characteristic degradation that might be caused by the shape of the intercoupling circuit 250, the conductive line 251 of the intercoupling circuit 250 implemented based on another embodiment of the disclosed technology may further extends from the second floating diffusion FD2 between the seventh unit pixel 227 and the eighth unit pixel 228 as shown by the dash-dotted lines in FIG. 3. Also, as a modification of the conductive line 251 of the intercoupling circuit 250 illustrated in FIG. 3, the conductive line 251 of the intercoupling circuit 250 may further extend from the first floating diffusion FD1 between the first unit pixel 211 and the second unit pixel 212 as shown by the dash-dotted lines in FIG. 4.

As described above, in the image sensors implemented based on an embodiment of the disclosed technology illustrated in FIG. 1 and FIG. 2, in each of the plurality of pixel blocks 110, since the positions of the first driving circuit 231 and the second driving circuit 232 are different and the second driving circuit 232 includes the portion of the second driving circuit 232 extending between adjacent light receiving circuits 210 and 220, it is possible to easily increase the sizes of the pixel transistors to provide the pixel transistors having maximum sizes within a limited area. In particular, by providing the driver transistor DX, which has a channel length corresponding to the first pitch W1 of the first light receiving circuit 210 and the second light receiving circuit 220, the operational characteristics of the image sensors may be significantly improved.

Moreover, the plurality of pixel blocks 110-1, 110-2, 110-3 arranged in a zigzag form in the third and fourth sub pixel arrays 103 and 104 makes better use of a space in which the driving circuit including the pixel transistors is formed, and driving loads for the first driving circuit 231 and the second driving circuit 232 may decrease. This will be described below in detail with reference to FIG. 5.

Further, in the third and fourth sub pixel arrays 103 and 104, since the first driving circuit 231 and the second driving circuit 232 of each of the plurality of pixel blocks 110 are disposed in a zigzag manner, it is possible to prevent the characteristics of the first driving circuit 231 and the second driving circuit 232 from degrading due to interference.

FIG. 5 is an equivalent circuit diagram corresponding to a first sub pixel array to a fourth sub pixel array of the image sensor based on some embodiments of the disclosed technology. A method of reducing the driving loads of driving circuits by disposing a plurality of pixel blocks in a zigzag form will be described with reference to FIGS. 1 to 5.

Referring to FIGS. 1 to 5, each of the first sub pixel array 101 to the fourth sub pixel array 104 includes the plurality of pixel blocks 110-1, 110-2, 110-3 are disposed in a zigzag form. Therefore, the first light receiving circuit 210 of the second pixel block 110-2 may be activated in response to a first transfer signal TRF1 to a fourth transfer signal TRF4. The first light receiving circuit 210 of the first pixel block 110-1 and the second light receiving circuit 220 of the second pixel block 110-2 may be simultaneously activated in response to a fifth transfer signal TRF5 to an eighth transfer signal TRF8. This is because the first light receiving circuit 210 of the first pixel block 110-1 and the second light receiving circuit 220 of the second pixel block 110-2 are arranged in the first direction D1 in which row lines to be applied with transfer signals TRF extend. Similarly, the second light receiving circuit 220 of the first pixel block 110-1 and the first light receiving circuit 210 of the third pixel block 110-3 may be simultaneously activated in response to a ninth transfer signal TRF9 to a twelfth transfer signal TRF12. The second light receiving circuit 220 of the third pixel block 110-3 may be activated in response to a thirteenth transfer signal TRF13 to a sixteenth transfer signal TRF16.

Where the fifth transfer signal TRF5 to the eighth transfer signal TRF8 are applied to each of the first sub pixel array 101 to the fourth sub pixel array 104, at a timing at which the fifth transfer signal TRF5 to the eighth transfer signal TRF8 are applied to the respective light receiving circuits 210 and 220, only four unit pixels, among the total eight unit pixels in each of the first pixel block 110-1 and the second pixel block 110-2, may operate. For example, in response to the fifth transfer signal TRF5 to the eighth transfer signal TRF8, the first pixel block 110-1 may sequentially transfer the photocharges generated in the first unit pixel 211 to the fourth unit pixel 214 to the first floating diffusion FD1, and the second pixel block 110-2 may sequentially transfer the photocharges generated in the fifth unit pixel 225 to the eighth unit pixel 228 to the second floating diffusion FD2. As a result, when outputting output signals such as image signals and image reset signals, in each pixel block 110, driving loads may decrease.

In detail, at the timing at which the fifth transfer signal TRF5 to the eighth transfer signal TRF8 are applied, because only four unit pixels among the total eight unit pixels in each of the first pixel block 110-1 and the second pixel block 110-2, operate, the image sensor implemented based on an embodiment of the disclosed technology may reduce by one half the amount of current to be applied to signal lines for applying input signals such as the reset signal RST and the select signal SEL to the first driving circuit 231 and the second driving circuit 232. Also, the image sensor implemented based on an embodiment of the disclosed technology may reduce by one half the amount of current of power lines for supplying the reset voltage Vr and the driver voltage Vd to the first driving circuit 231 and the second driving circuit 232. In this way, the driving loads of the first driving circuit 231 and the second driving circuit 232 may decrease. The signal lines for applying the reset signal RST and the select signal SEL may indicate row lines coupled to the reset gate RG and the selection gate SG, respectively.

At the timing at which the fifth transfer signal TRF5 to the eighth transfer signal TRF8 are applied, since the output signal of the first pixel block 110-1 is outputted to a first column line CL1 and the output signal of the second pixel block 110-2 is outputted to a second column line CL2, the image sensor implemented based on an embodiment of the disclosed technology may reduce by one half the amount of current to be applied to the column lines CL1 and CL2. In this way, the driving loads of a correlated double sampling (see the reference numeral 120 of FIG. 8) and an analog-digital converter (see the reference numeral 130 of FIG. 8) which are coupled to column lines may decrease.

Figure 6:
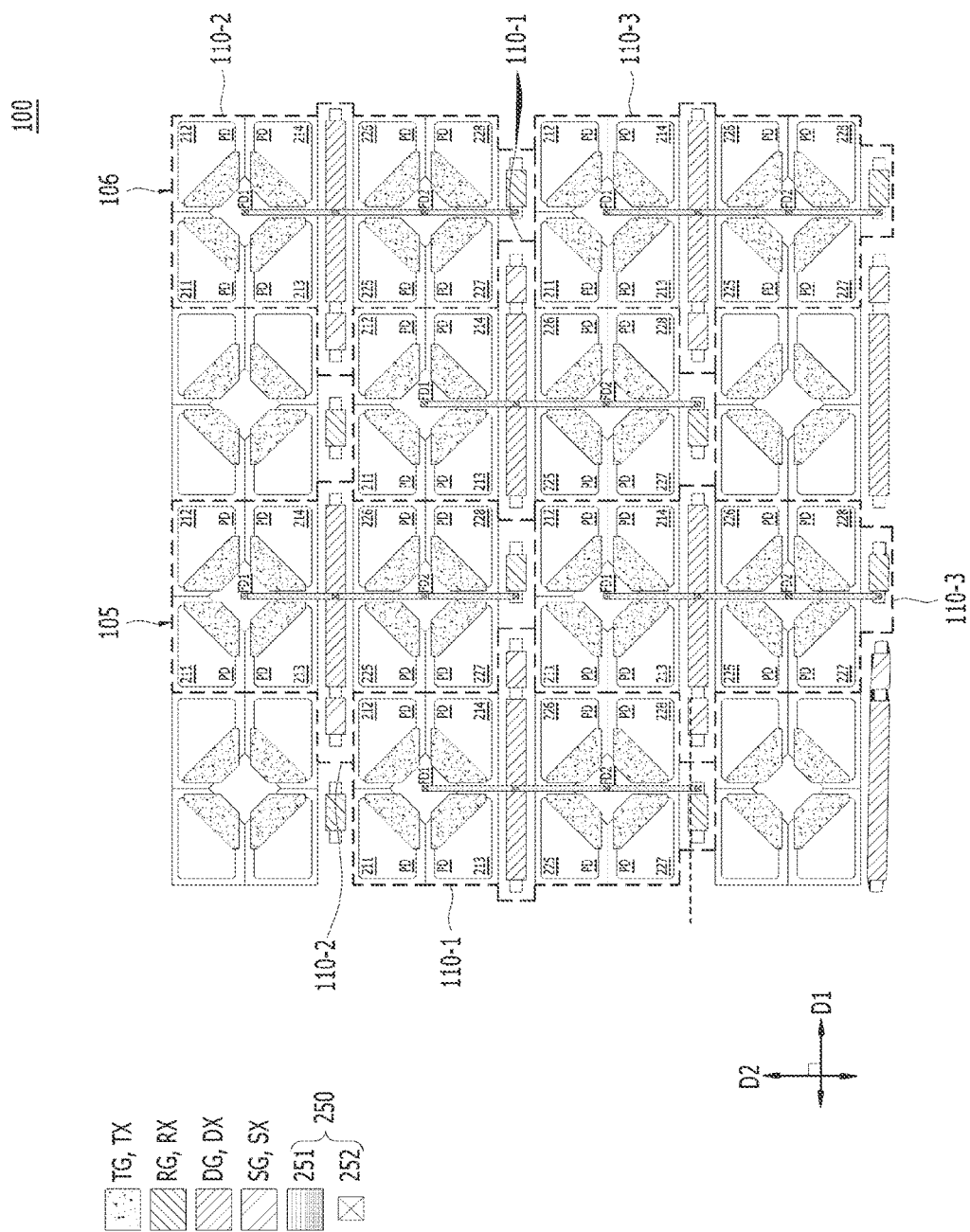
FIG. 6 is a layout illustrating an example of a pixel array of an image sensor based on an embodiment of the disclosed technology.

FIG. 6 is a layout illustrating an example of a pixel array of an image sensor based on an embodiment of the disclosed technology. The pixel array in FIG. 6 shows an example where the pixel blocks and the sub pixel array are arranged as shown in FIG. 1. Although not shown in the drawings, the pixel blocks and the sub pixel arrays shown in FIGS. 2 to 4 may also be applied to form a pixel array.

As shown in FIGS. 1 and 6, a pixel array 100 may include a plurality of sub pixel arrays. Each of the plurality of sub pixel arrays may include a plurality of pixel blocks 110, which are disposed in a zigzag form. That is to say, the pixel array 100 may include a plurality of pixel blocks 110 which are disposed in a zigzag form.

In the pixel array 100, pixel blocks 110 which are arranged in the second direction D2 (e.g., along the same column) may have the same two-dimensional arrangement. The two-dimensional arrangement of pixel blocks 110 arranged along an odd-numbered line extending in the second direction D2 (e.g., an odd-numbered column) and the two-dimensional arrangement of pixel blocks 110 arranged along an even-numbered line extending in the second direction D2 (e.g., an even-numbered column) may be symmetrical to each other.

Each of the plurality of sub pixel arrays may include a first pixel block 110-1 to a third pixel block 110-3, which are disposed adjacent to one another. The first pixel block 110-1 may be adjacent to the second pixel block 110-2 and the third pixel block 110-3 in the first direction D1, and the second pixel block 110-2 and the third pixel block 110-3 may be aligned in the second direction D2. The first light receiving circuit 210 of the first pixel block 110-1 may be aligned with the second light receiving circuit 220 of the second pixel block 110-2 in the first direction D1, and the second light receiving circuit 220 of the first pixel block 110-1 may be aligned with the first light receiving circuit 210 of the third pixel block 110-3 in the first direction D1. A driver transistor DX and a selection transistor SX of the first pixel block 110-1 may be aligned with a reset transistor RX of the second pixel block 110-2 in the first direction D1, and the selection transistor SX of the first pixel block 110-1 may be positioned between the second light receiving circuit 220 of the second pixel block 110-2 and the first light receiving circuit 210 of the third pixel block 110-3.

Any one sub pixel array among the plurality of sub pixel arrays (e.g., a first sub pixel array 106 which is adjacent to the first sub pixel array 105 in the first direction D1) may have asymmetrical two-dimensional arrangement with respect to the boundary where they adjoin each other.

As described above, as the plurality of pixel blocks 110-1, 110-2, or 110-3 are disposed in a zigzag form in the pixel array 100, it is possible to dispose the driving circuits of the plurality of pixel blocks 110 in a zigzag manner. In this way, characteristic deterioration due to the interference between adjacent driving circuits 230 may be minimized.

Figure 7:
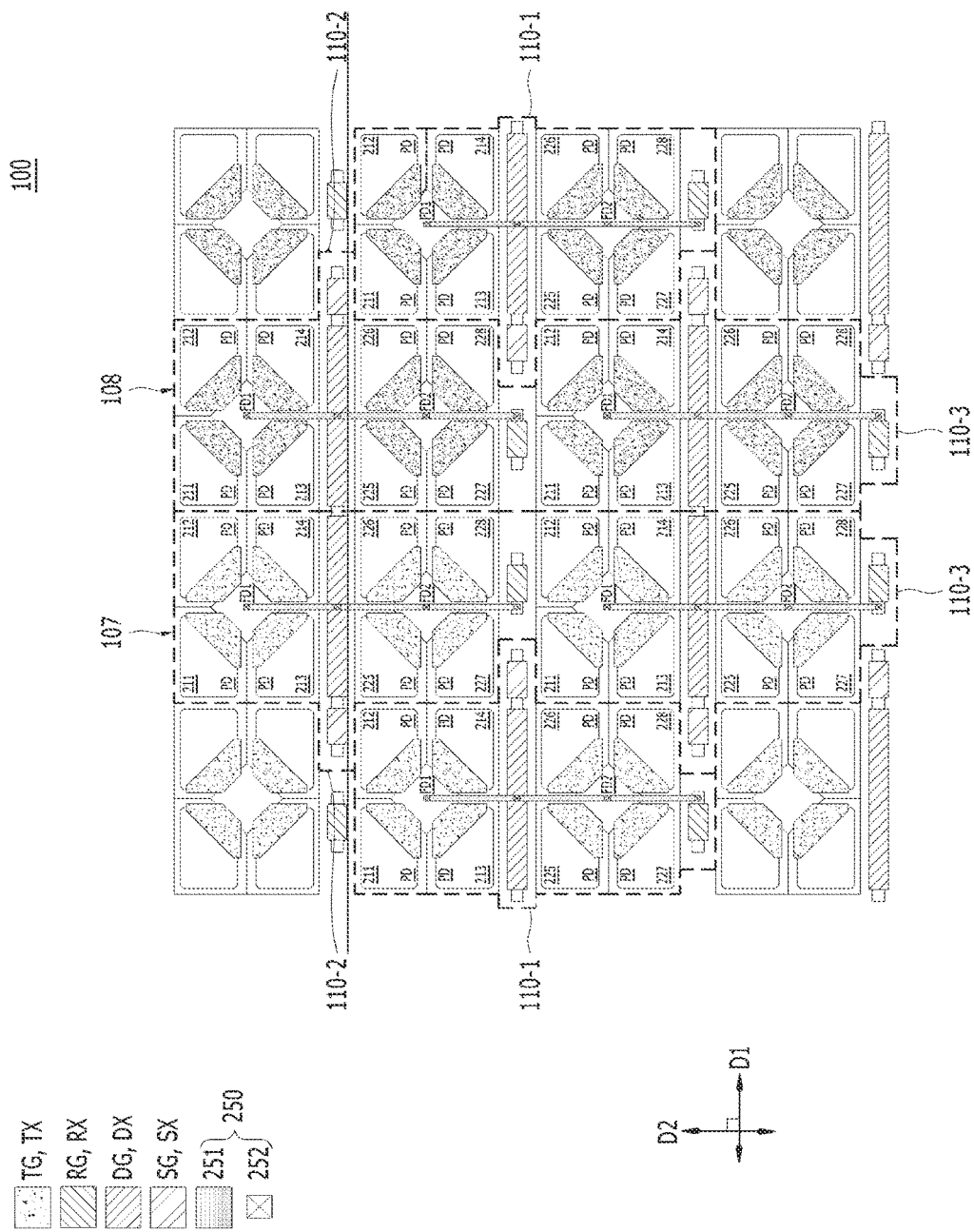
FIG. 7 is a layout illustrating an example of a pixel array of an image sensor based on another embodiment of the disclosed technology.

FIG. 7 is a layout illustrating an example of a pixel array of an image sensor based on another embodiment of the disclosed technology. The pixel array in FIG. 7 shows an example where the pixel blocks and the sub pixel array are arranged as shown in FIG. 1. Although not shown in the drawings, the pixel blocks and the sub pixel arrays shown in FIGS. 2 to 4 may also be applied to form a pixel array.

As shown in FIGS. 1 and 7, a pixel array 100 may include a plurality of sub pixel arrays. Each of the plurality of sub pixel arrays may include a plurality of pixel blocks 110 which are disposed in a zigzag form. That is to say, the pixel array 100 may include a plurality of pixel blocks 110 which are disposed in a zigzag form.

In the pixel array 100, pixel blocks 110-1, 110-2, or 110-3 which are arranged in the second direction D2 (e.g., along the same column) may have the same two-dimensional arrangement. The two-dimensional arrangement of pixel blocks 110-1, 110-2, or 110-3 positioned along an odd-numbered line extending in the second direction D2 (e.g., an odd-numbered column) and the two-dimensional arrangement of pixel blocks 110-1, 110-2, or 110-3 which are positioned along an even-numbered line extending in the second direction D2 (e.g., an even-numbered column) may be symmetrical to each other.

Each of the plurality of sub pixel arrays may include a first pixel block 110-1 to a third pixel block 110-3 which are disposed adjacent to one another. The first pixel block 110-1 may be adjacent to the second pixel block 110-2 and the third pixel block 110-3 in the first direction D1, and the second pixel block 110-2 and the third pixel block 110-3 may be aligned in the second direction D2. The first light receiving circuit 210 of the first pixel block 110-1 may be aligned with the second light receiving circuit 220 of the second pixel block 110-2 in the first direction D1, and the second light receiving circuit 220 of the first pixel block 110-1 may be aligned with the first light receiving circuit 210 of the third pixel block 110-3 in the first direction D1. A driver transistor DX and a selection transistor SX of the first pixel block 110-1 may be aligned with a reset transistor RX of the second pixel block 110-2 in the first direction D1, and the selection transistor SX of the first pixel block 110-1 may be positioned between the second light receiving circuit 220 of the second pixel block 110-2 and the first light receiving circuit 210 of the third pixel block 110-3.

Any one sub pixel array among the plurality of sub pixel arrays (e.g., a first sub pixel array 107, and a second sub pixel array 108 which is adjacent to the first sub pixel array 107 in the first direction D1) may have symmetrical two-dimensional arrangement with respect to the boundary where they adjoin each other. In this way, driver transistors DX may be positioned adjacent to the boundary where the first sub pixel array 107 and the second sub pixel array 108 adjoin each other, and the drain of the driver transistors DX, which is supplied with the driver voltage Vd may be shared. For example, the second pixel block 110-2 of the first sub pixel array 107 and the second pixel block 110-2 of the second sub pixel array 108 may be symmetrical with respect to the boundary where the first sub pixel array 107 and the second sub pixel array 108 adjoin each other, and the driver transistors DX thereof may have shapes which face each other. Therefore, the driver transistor DX, which is positioned in the second pixel block 110-2 of the first sub pixel array 107 and the driver transistor DX, which is positioned in the second pixel block 110-2 of the second sub pixel array 108, may share a drain. The shared drain of the driver transistors DX may be positioned at the boundary where the first sub pixel array 107 and the second sub pixel array 108 adjoin each other.

Although not shown in the drawings, reset transistors RX may be positioned adjacent to the boundary where the first sub pixel array 107 and the second sub pixel array 108 adjoin each other, and the drain of the reset transistors RX, which is supplied with the reset voltage Vr, may be shared.

As described above, since adjacent sub pixel arrays in the pixel array 100 are symmetrical with respect to the boundary where they adjoin each other, it is possible to provide driving circuits that share the drain of the driver transistors DX or/and the drain of the reset transistors RX to effectively provide a space where pixel transistors are to be formed.

Figure 8:
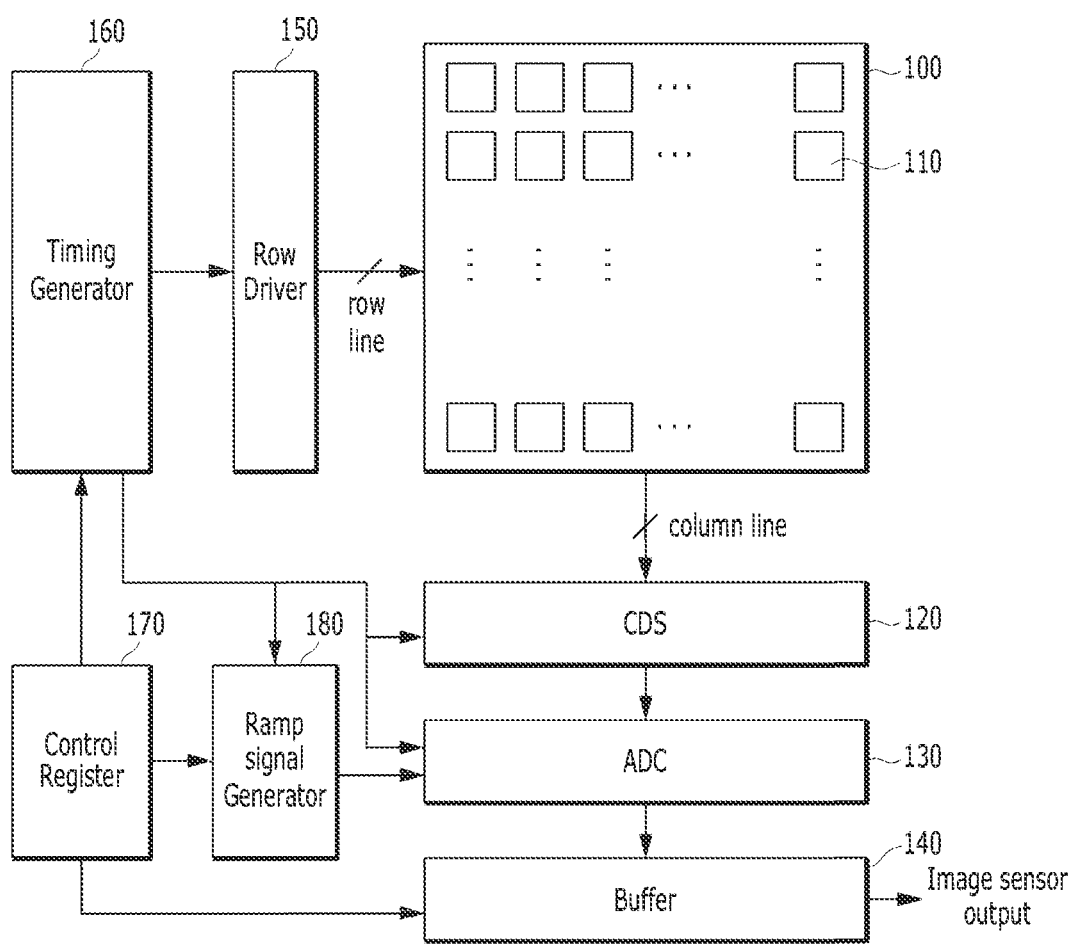
FIG. 8 is a block diagram schematically illustrating an example of an image sensor based on an embodiment of the disclosed technology.

FIG. 8 is a block diagram schematically illustrating an example of an image sensor based on an embodiment of the disclosed technology.

As shown in FIG. 8, the image sensor may include a pixel array 100 in which a plurality of pixel blocks 110 are arranged in a matrix structure, a correlated double sampling (CDS) 120, an analog-digital converter (ADC) 130, a buffer 140, a row driver 150, a timing generator 160, a control register 170, and a ramp signal generator 180.

The timing generator 160 generates one or more control signals for controlling the respective operations of the row driver 150, the correlated double sampling 120, the analog-digital converter 130 and the ramp signal generator 180. The control register 170 generates one or more control signals for controlling the respective operations of the ramp signal generator 180, the timing generator 160 and the buffer 140.

The row driver 150 drives the pixel array 100 on a row line basis. For example, the row driver 150 may generate a select signal for selecting any one row line among a plurality of row lines. Each of the plurality of row lines is coupled to a plurality of pixel blocks 110. Each of the plurality of pixel blocks 110 is coupled to one row line.

Each of the plurality of pixel blocks 110 senses incident light, and outputs an image reset signal and an image signal to the correlated double sampling 120 through a column line. The correlated double sampling 120 performs sampling for each of the image reset signal and the image signal received therein. Each of a plurality of column lines is coupled to a plurality of pixel blocks 110. Each of the plurality of pixel blocks 110 is coupled to one column line. The analog-digital converter 130 compares a ramp signal which is outputted from the ramp signal generator 180 and a sampling signal which is outputted from the correlated double sampling 120, and outputs a comparison signal. The analog-digital converter 130 counts a number of clock signals provided from the timing generator 160 based on a transition time of the comparison signal, and outputs a count value to the buffer 140. The ramp signal generator 180 may operate under control of the timing generator 160.

The buffer 140 stores a plurality of digital signals outputted from the analog-digital converter 130, senses and amplifies the respective digital signals, and outputs resultant signals. Thus, the buffer 140 may include a memory (not shown) and a sense amplifier (not shown). The memory stores count values, and the count values mean the count values associated with the signals outputted from the plurality of pixel blocks 110. The sense amplifier senses and amplifies the respective count values outputted from the memory.

The image sensor discussed above may be used in various electronic devices or systems. For example, the image sensor implemented based on various embodiments of the disclosed technology may be applied to a camera as illustrated in FIG. 9.

Figure 9:
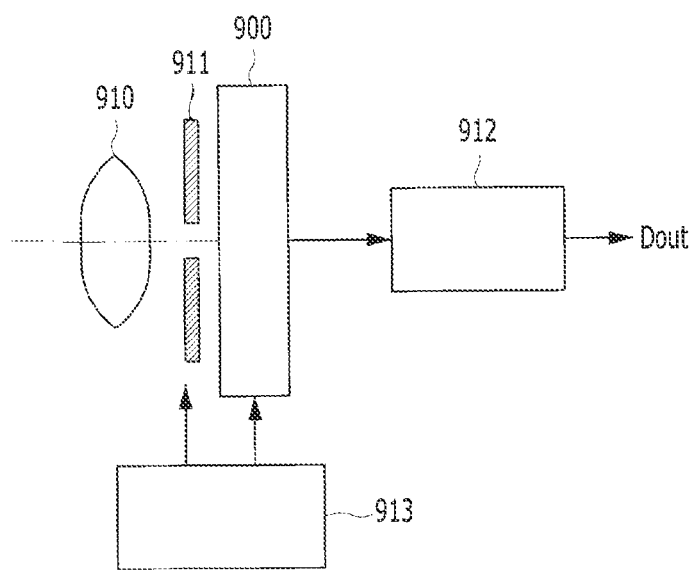
FIG. 9 is a diagram schematically illustrating an example of an electronic device including the image sensor based on some embodiments of the disclosed technology.

FIG. 9 is a diagram schematically illustrating an example of an electronic device including the image sensor implemented based on some embodiments of the disclosed technology.

Referring to FIG. 9, the electronic device including the image sensor implemented based on various embodiments of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 8) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

As is apparent from the above descriptions, in various embodiments of the disclosed technology, since positions where a reset transistor and a driver transistor are formed in each of a plurality of pixel blocks are different from each other and a selection transistor, which is coupled in series to the driver transistor, has a shape that extends between adjacent light receiving circuits, it is possible to easily increase the sizes of pixel transistors to provide the pixel transistors having maximum sizes within a limited area. By providing the driver transistor with a channel length corresponding to the pitch of each light receiving circuit, it is possible to significantly improve the operational characteristics of an image sensor.

Moreover, in a sub pixel array and a pixel array in which a plurality of pixel blocks are arranged, since the plurality of pixel blocks are disposed in a zigzag form, it is easy to provide a space where the pixel transistors are to be formed, and it is possible to reduce the driving loads of the pixel transistors.

Further, in the sub pixel array and the pixel array in which a plurality of pixel blocks are arranged, since pixel transistors performing the same function are disposed in a staggered manner with respect to one another, it is possible to minimize characteristic degradation that might be caused by interference.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a pixel array including a plurality of pixel blocks operable to convert light into electrical signals, each of the plurality of pixel blocks comprising:
a first light receiving circuit including a plurality of unit pixels that share a first floating diffusion;
a second light receiving circuit arranged adjacent to the first light receiving circuit in a second direction, and including a plurality of unit pixels that share a second floating diffusion;
a reset transistor electrically coupled to the first light receiving circuit and the second light receiving circuit, and positioned between the first light receiving circuit and the second light receiving circuit; and
a driver transistor and a selection transistor electrically coupled to the first light receiving circuit and the second light receiving circuit, and positioned adjacent to the first light receiving circuit or the second light receiving circuit, wherein the driver transistor and the selection transistor are coupled in series,
wherein the driver transistor has a shape that extends in a first direction crossing the second direction, wherein the first floating diffusion is configured to be electrically coupled to the second floating diffusion,
wherein a source of the reset transistor is aligned with the first floating diffusion and the second floating diffusion in the second direction.

2. The image sensor according to claim 1, further comprising:
an intercoupling circuit configured to electrically couple the first floating diffusion, the second floating diffusion, a gate of the driver transistor and a source of the reset transistor,
wherein the intercoupling circuit has a line shape that straightly extends in the second direction.

3. The image sensor according to claim 2, wherein the plurality of pixel blocks are disposed in a zigzag form in the pixel array.

4. The image sensor according to claim 1, wherein pixel blocks arranged along a same line in the second direction have the same two-dimensional arrangement.

5. The image sensor according to claim 1, wherein two-dimensional arrangements of pixel blocks arranged along an odd-numbered line in the second direction are symmetrical to two-dimensional arrangements of pixel blocks arranged along an even-numbered line in the second direction.

6. The image sensor according to claim 1, wherein, in each of the plurality of pixel blocks, the driver transistor has a channel length corresponding to a pitch of the first light receiving circuit or a pitch of the second light receiving circuit in the first direction.

7. The image sensor according to claim 1, wherein, in each of the plurality of pixel blocks, the driver transistor is aligned with the first light receiving circuit and the second light receiving circuit in the second direction, and the selection transistor has a shape that projects out from the first light receiving circuit and the second light receiving circuit between the first light receiving circuit and the second light receiving circuit of adjacent pixel block in the first direction.

8. The image sensor according to claim 1, wherein the selection transistor of a first pixel block among the plurality of pixel blocks is positioned between the first light receiving circuit and the second light receiving circuit of a second pixel block among the plurality of pixel blocks, wherein the second pixel block is adjacent to the first pixel block in the first direction.

9. The image sensor according to claim 1,
wherein the pixel array comprises a plurality of sub pixel arrays,
wherein each of the plurality of sub pixel arrays comprises first to third pixel blocks positioned adjacent to one another, among the plurality of pixel blocks,
wherein the first pixel block is adjacent to the second pixel block and the third pixel block in the first direction, and the second pixel block and the third pixel block are aligned in the second direction, and
wherein the first light receiving circuit of the first pixel block is aligned with the second light receiving circuit of the second pixel block in the first direction, and the second light receiving circuit of the first pixel block is aligned with the first light receiving circuit of the third pixel block in the first direction.

10. The image sensor according to claim 9,
wherein the driver transistor and the selection transistor of the first pixel block are aligned with the reset transistor of the second pixel block or the reset transistor of the third pixel block in the first direction, and
wherein the selection transistor of the first pixel block is positioned between the first light receiving circuit and the second light receiving circuit of the second pixel block or between the first light receiving circuit and the second light receiving circuit of the third pixel block.

11. The image sensor according to claim 9, wherein, among the plurality of sub pixel arrays, a first sub pixel array and a second sub pixel array, which is adjacent to the first sub pixel array in the first direction, have two-dimensional arrangements that are asymmetrical with respect to a boundary where they adjoin each other.

12. The image sensor according to claim 9, wherein, among the plurality of sub pixel arrays, a first sub pixel array and a second sub pixel array, which is adjacent to the first sub pixel array in the first direction, have two-dimensional arrangements that are symmetrical with respect to a boundary where they adjoin each other.

13. The image sensor according to claim 12, wherein the image sensor includes driver transistors positioned adjacent to the boundary where the first sub pixel array and the second sub pixel array adjoin each other, and wherein the driver transistors share a drain supplied with a driver voltage.

14. The image sensor according to claim 1, wherein:
the plurality of unit pixels of the first light receiving circuit include at least four photoelectric conversion elements that share the first floating diffusion, and
the plurality of unit pixels of the second light receiving circuit include at least four photoelectric conversion elements that share the second floating diffusion.

15. An image sensor comprising:
a pixel array including a plurality of pixel blocks operable to convert light into electrical signals,
each of the plurality of pixel blocks comprising:
a first light receiving circuit including at least four photoelectric conversion elements that share a first floating diffusion;
a second light receiving circuit arranged adjacent to the first light receiving circuit in a column direction, and including at least four photoelectric conversion elements that share a second floating diffusion;
a reset transistor positioned between the first light receiving circuit and the second light receiving circuit;
a driver transistor positioned adjacent to the other side facing away from one side of the first light receiving circuit or the second light receiving circuit; and
a selection transistor positioned adjacent to and aligned with the driver transistor in a row direction,
wherein the first floating diffusion, the second floating diffusion, a source of the reset transistor, and a gate of the driver transistor are electrically connected with each other, and
wherein a source of the driver transistor and a drain of the selection transistor are electrically and directly connected to each other through an intercoupling circuit,
wherein the intercoupling circuit has a line shape that straightly extends in the column direction.

16. The image sensor according to claim 15, wherein:
the plurality of pixel blocks include a first pixel block and a second pixel block, which is positioned adjacent to the first pixel block in the row direction, and
the select transistor of the first pixel block is aligned to the reset transistor of the second pixel block in the row direction.

17. The image sensor according to claim 16, wherein the selection transistor of a first pixel block among the plurality of pixel blocks is positioned between the first light receiving circuit and the second light receiving circuit of a second pixel block, which is adjacent to the first pixel block in the row direction.

18. The image sensor according to claim 15, wherein the select transistor projects out from the first light receiving circuit and the second light receiving circuit.

* * * * *